(12) United States Patent
Huang (10) Patent No.: US 10,902,762 B2
(45) Date of Patent: Jan. 26, 2021

(54) PROTECTIVE CIRCUIT AND DISPLAY DEVICE

(71) Applicant: HKC Corporation Limited, Shenzhen (CN)

(72) Inventor: Beizhou Huang, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 144 days.

(21) Appl. No.: 16/328,921

(22) PCT Filed: Dec. 20, 2017

(86) PCT No.: PCT/CN2017/117334
§ 371 (c)(1),
(2) Date: Feb. 27, 2019

(87) PCT Pub. No.: WO2019/061879
PCT Pub. Date: Apr. 4, 2019

(65) Prior Publication Data
US 2020/0013319 A1    Jan. 9, 2020

(30) Foreign Application Priority Data

Sep. 26, 2017  (CN) .......................... 2017 1 0882671

(51) Int. Cl.
*H02H 9/04*    (2006.01)
*H02H 11/00*   (2006.01)
(Continued)

(52) U.S. Cl.
CPC ........... *G09G 3/006* (2013.01); *H01H 37/002* (2013.01); *H01H 37/32* (2013.01);
(Continued)

(58) Field of Classification Search
CPC .... H02H 9/044; H02H 11/002; H02H 11/003; H01L 27/0255
(Continued)

(56) References Cited

U.S. PATENT DOCUMENTS 7,345,499 B2*  3/2008  Billingsley ............ G01R 1/203
                                                      361/101
2003/0052707 A1*  3/2003  Buckland ....... H03K 19/018585
                                                       326/21
(Continued)

FOREIGN PATENT DOCUMENTS

CN       101277085 A       10/2008
CN       101458405 A       6/2009
(Continued)

*Primary Examiner* — Gary A Nash
(74) *Attorney, Agent, or Firm* — Muncy, Geissler, Olds & Lowe, P.C.

(57) ABSTRACT

This application provides a protective circuit and a display device. The protective circuit includes a control line, a transmission line, and an active switch. The control line transmits a control signal; the transmission line includes an input line and an output line; and a control end of the active switch is electrically coupled to the control line, a first end of the active switch is connected to the input line, and a second end of the active switch is connected to the output line. A protected wire is arranged between the input line and the output line.

20 Claims, 8 Drawing Sheets

(51) Int. Cl.
  *H01L 27/02*  (2006.01)
  *G09G 3/00*  (2006.01)
  *H01H 37/00*  (2006.01)
  *H01H 37/32*  (2006.01)

(52) U.S. Cl.
  CPC . *G09G 2330/021* (2013.01); *G09G 2330/045* (2013.01); *H01L 27/0255* (2013.01); *H02H 9/044* (2013.01); *H02H 11/002* (2013.01); *H02H 11/003* (2013.01)

(58) Field of Classification Search
  USPC ........ 323/289; 361/56, 91.1, 91.5, 91.7, 101
  See application file for complete search history.

(56) References Cited

U.S. PATENT DOCUMENTS

| | | | |
|---|---|---|---|
| 2006/0245120 A1 | 11/2006 | Kang | |
| 2008/0130180 A1* | 6/2008 | de Palma | H02H 9/042 361/56 |
| 2014/0257632 A1* | 9/2014 | Kanzaki | B60R 16/033 701/36 |
| 2016/0241014 A1* | 8/2016 | Asano | H01L 27/0647 |

FOREIGN PATENT DOCUMENTS

| | | |
|---|---|---|
| CN | 104111550 A | 10/2014 |
| CN | 106098007 A | 11/2016 |
| KR | 20080056355 A | 6/2008 |

\* cited by examiner

PROTECTIVE CIRCUIT AND DISPLAY DEVICE

BACKGROUND

Technical Field

This application relates to the field of line protection technologies, and in particular, to a protective circuit and a display device.

Related Art

In an active array switch (thin film transistor, TFT) display, a system board is connected to a control board (C-board) by using a line. For example, the C-board is connected to a printed circuit board (PCB) by using a flexible flat cable (FFC), and the PCB is connected to a display area by using a source chip-on-film (S-COF) and a gate chip-on-film (G-COF). A drive manner of the display includes: The system board transmits a color (for example, R/G/B) compressed signal, a control signal, and power to the C-board. After the signals are processed by a timing controller (TCON) on the C-board, the signals are transmitted to a source circuit and a gate circuit of the PCB. Necessary data and power are transmitted to the display area by using the S-COF and the G-COF, so that the display obtains the power and signals required for image presentation.

On the display panel, lines transmitting relatively high voltages such as a gate turn-on voltage, a gate turn-off voltage, a basic voltage, and a related scanning signal are arranged in a fan-out area of the G-COF side. For another example, lines transmitting relatively high voltages such as a data signal and a gamma voltage are arranged in a fan-out area of the S-COF side. By using such lines, a short circuit between a high-voltage signal and grounding (GND) or a high-voltage signal is caused due to foreign matter in a manufacturing process. Consequently, a panel is heated, and finally the panel is burned.

SUMMARY

To resolve the foregoing technical problem, an objective of this application is to provide a protective circuit and a display device, to resolve a problem such as a short circuit between a high-voltage signal and GND or a high-voltage signal of lines caused by foreign matter in a manufacturing process.

The objective of this application and a solution to the technical problem are implemented by using the following technical solutions. A protective circuit is provided according to this application. The protective circuit comprises: a control line, configured to transmit a control signal; a transmission line, comprising an input line and an output line; an active switch, where a control end of the active switch is electrically coupled to the control line, a first end of the active switch is connected to the input line, and a second end of the active switch is connected to the output line; and a protected wire, arranged between the input line and the output line, where when the control signal electrically coupling to the control end of the active switch is at a low potential, the input line and the output line form a closed circuit by using the protected wire; when the input line obtains power greater than a maximum power threshold the protected line can bear, the protected line is fused, the input line and the output line form a broken circuit, and the input line and the output line are broken circuits; when the control signal electrically coupling to the control end of the active switch is at a high potential, the active switch is turned on, and the input line and the output line form a closed circuit by using the active switch.

According to this application, the solution to the technical problem may be further implemented by using the following technical measures.

In an embodiment of this application, the protected wire is made of a thermo-sensitive conductive material.

In an embodiment of this application, the control line is electrically coupled to a signal generation module, where the signal generation module generates the control signal.

In an embodiment of this application, the signal generation module comprises a system board, a TCON, a source circuit, a gate circuit, or a power driver module.

In an embodiment of this application, the output line is arranged in a fan-out area of a display panel.

In an embodiment of this application, the transmission line is a conductive line connected to an effective display area of a display panel.

In an embodiment of this application, the conductive line comprises at least one of a scanning line, a data line, a benchmark voltage line, and a gamma voltage transmission line.

In an embodiment of this application, the control signal is switched between a high potential and a low potential.

In an embodiment of this application, the active switch is an n-type metal-oxide-semiconductor (N-MOS) field-effect transistor.

In an embodiment of this application, the first end is a drain, and the second end is a source.

Another objective of this application is to provide a protective circuit, arranged on a display panel, and comprising: a control line, configured to transmit a control signal, where the control signal is switched between a high potential and a low potential; a transmission line, comprising an input line and an output line; an active switch, where a control end of the active switch is electrically coupled to the control line, a first end of the active switch is connected to the input line, and a second end of the active switch is connected to the output line; and a thermo-sensitive conductive material wire, arranged between the input line and the output line, where the active switch is arranged between a drive circuit and a display area of the display panel, the active switch is an N-MOS field-effect transistor, the first end is a drain, the second end is a source, and the drive circuit comprises at least one of a gate drive circuit and a source drive circuit; when the control signal is at a low potential, the input line and the output line form a closed circuit by using the thermo-sensitive conductive material line; when the input line obtains power greater than a maximum power threshold the thermo-sensitive conductive material wire can bear, the thermo-sensitive conductive material wire is fused, the input line and the output line form a broken circuit, and the input line and the output line are broken circuits; when the control signal electrically coupling to the control end of the active switch is at a high potential, the active switch is turned on, and the input line and the output line form a closed circuit by using the active switch.

Still another objective of this application is to provide a display device, comprising: a display panel, comprising a display area and a fan-out area; and a control module, where the control module comprises: a control line, configured to transmit a control signal; a transmission line, comprising an input line and an output line, where a thermo-sensitive conductive material wire is arranged between the input line and the output line, the transmission line transmits power, and the transmission line or the output line is arranged in the fan-out area; and an active switch, where a control end of the active switch is electrically coupled to the control signal, a first end of the active switch is connected to the input line, a second end of the active switch is connected to the output line, where when the control signal electrically coupling to the control end of the active switch is at a low potential, the input line and the output line form a closed circuit by using the thermo-sensitive conductive material wire; when the input line obtains the power greater than a maximum power threshold the thermo-sensitive conductive material wire can bear, the protected line is fused, the input line and the output line form a broken circuit, and the input line and the output line are broken circuits; when the control signal electrically coupling to the control end of the active switch is at a high potential, the active switch is turned on, and the input line and the output line form a closed circuit by using the active switch.

In an embodiment of this application, the active switch is arranged between a drive circuit and the display area.

This application resolves the problem that a panel is heated and finally burned due to a short circuit between a high-voltage signal and GND or a high-voltage signal of lines without significantly changing an existing production process and increasing product costs while maintaining an original manufacturing process requirement, where the short circuit is caused by foreign matter in a manufacturing process. In addition, overheat protection for the short circuit is implemented, and a function is recovered after repair.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface", merely refer to directions in the accompanying drawings. Therefore, the used terms about directions are used to describe and understand this application, and are not intended to limit this application.

The accompanying drawings and the description are considered to be essentially exemplary, rather than limitative. In the figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged, and presentation of circuit configuration in a related area is also enlarged. In the accompanying drawings, for understanding and ease of description, thicknesses of a layer, a film, a panel, and an area are enlarged, and presentation of circuit configuration in a related area is also enlarged. It should be understood that when a component such as a layer, a film, an area, or a base is described to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout the specification, "on" means that one is located above or below a target component and does not necessarily mean that one is located on the top based on a gravity direction.

To further describe the technical measures taken in this application to achieve the intended application objective and effects thereof, specific implementations, structures, features, and effects of a protective circuit and a display device that are provided according to this application are described below in detail with reference to the drawings and specific embodiments.

A display panel in this application may include a first substrate and a second substrate. The first substrate and the second substrate may be, for example, active array switch (Thin Film Transistor, TFT) substrates or color filter (CF) substrates. However, the first substrate and the second substrate are not limited thereto, and in some embodiments, an active array switch and a CF in this application may alternatively be formed on a same substrate.

In some embodiments, the display panel in this application may be, for example, a liquid crystal display panel. However, the display panel is not limited thereto, and may alternatively be an OLED display panel, a W-OLED display panel, a QLED display panel, a plasma display panel, a curved display panel, or a display panel of another type.

Figure 1A:
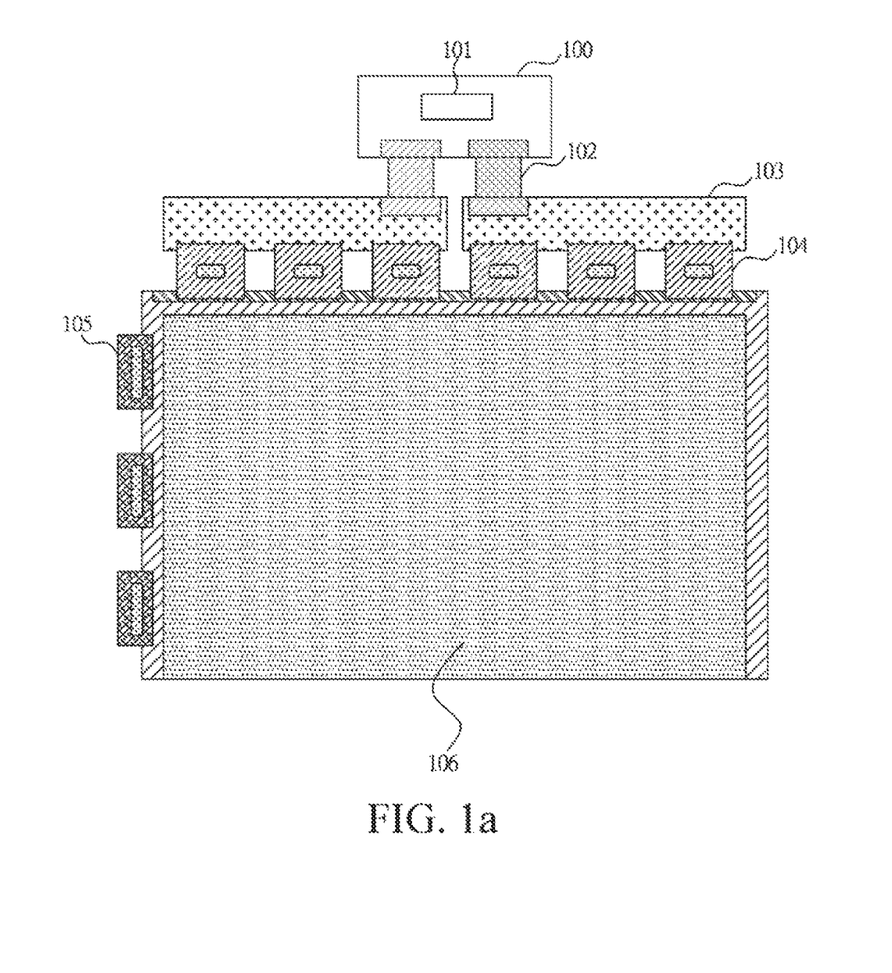
FIG. 1a is a schematic structural diagram of configuration of an exemplary display device.

FIG. 1a is a schematic structural diagram of configuration of an exemplary display device. As shown in FIG. 1a, a drive manner of the display device includes: A system board provides and transmits a color (for example, R/G/B) compressed signal, a control signal, and power to a C-board 100. After such signals are processed by a TCON 101 on the C-board 100, the signals are transmitted, for example, by using an FFC 102, to a source circuit and a gate circuit of a PCB 103 together with power processed or adjusted by a power driver module (not shown), and necessary data and power are transmitted to a display area 106 by using an S-COF 104 and a G-COF 105, so that a display obtains the power and signals required for image presentation.

Figure 1B:
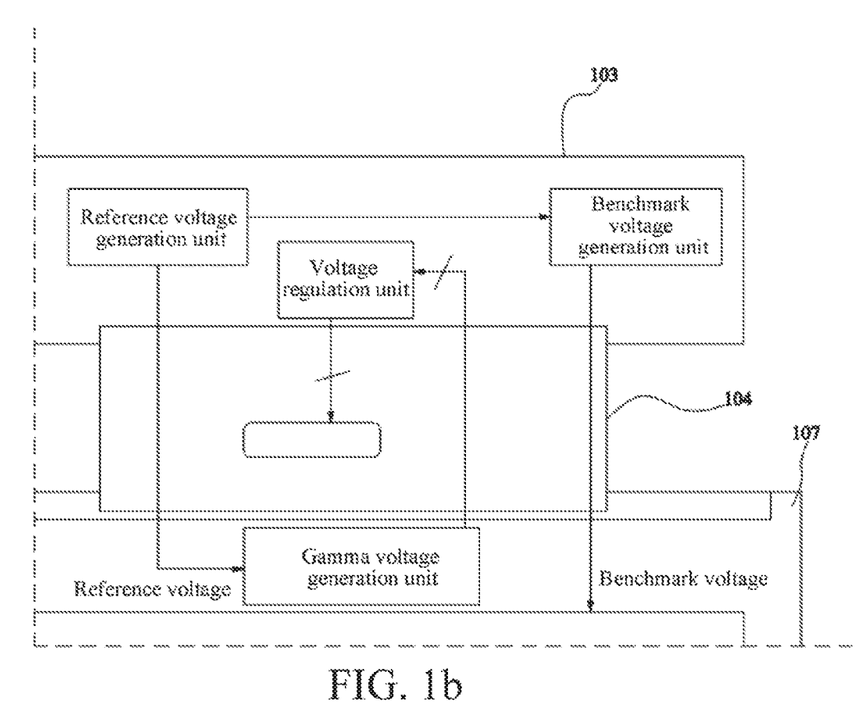
FIG. 1b is a simplified schematic diagram of lines in a fan-out area of an exemplary display device.

FIG. 1b is a simplified schematic diagram of lines on a G-COF side of an exemplary display device. In some embodiments, lines transmitting relatively high-voltage input signals such as a data signal and a gamma reference voltage are arranged in a fan-out area 107 of a display panel, for example, a fan-out area of an S-COF side. Such lines are configured to provide the data signal, and the gamma reference voltage is further provided to a display area of the display panel, to drive each pixel circuit of the display panel by using gray-scale voltages of different values.

In some embodiments, lines transmitting relatively high-voltage input signals such as a gate turn-on voltage, a gate turn-off voltage, a reference voltage, and a related scanning signal are arranged in a fan-out area 107 of a display panel, for example, a fan-out area of a G-COF side. Such lines are configured to control operation actions such as on and off of a gate line and pixel charging and discharging.

However, in a manufacturing process of a display panel, by using such high-voltage lines, a short circuit between a high-voltage signal and GND or a high-voltage signal likely occurs due to foreign matter in the manufacturing process. Consequently, the panel is heated, and finally the panel is burned.

Figure 2:
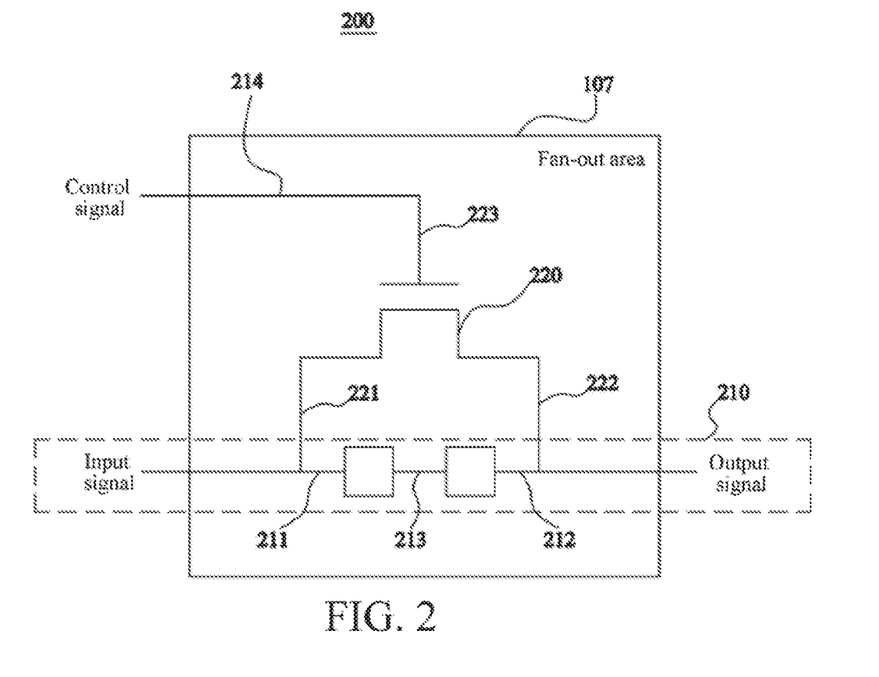
FIG. 2 is a schematic architectural diagram of a protective circuit of a display panel where an embodiment of a method according to this application is applied.

FIG. 2 is a schematic architectural diagram of a protective circuit of a display panel where an embodiment of a method according to this application is applied. In an embodiment of this application, the protective circuit 200 includes: a transmission line 210, including an input line 211 and an output line 212; a control line 214, configured to transmit a control signal; and an active switch 220, where a control end 223 of the active switch 220 is electrically coupled to the control line 214, a first end 221 of the active switch 220 is connected to the input line 211, and a second end 222 of the active switch 220 is connected to the output line 212. A protected wire 213 is arranged between the input line 211 and the output line 212.

In some embodiments, the protected wire 213 is made of a thermo-sensitive conductive material, for example, a thermo-sensitive conductive adhesive or a low-temperature fuse metal.

Figure 3A:
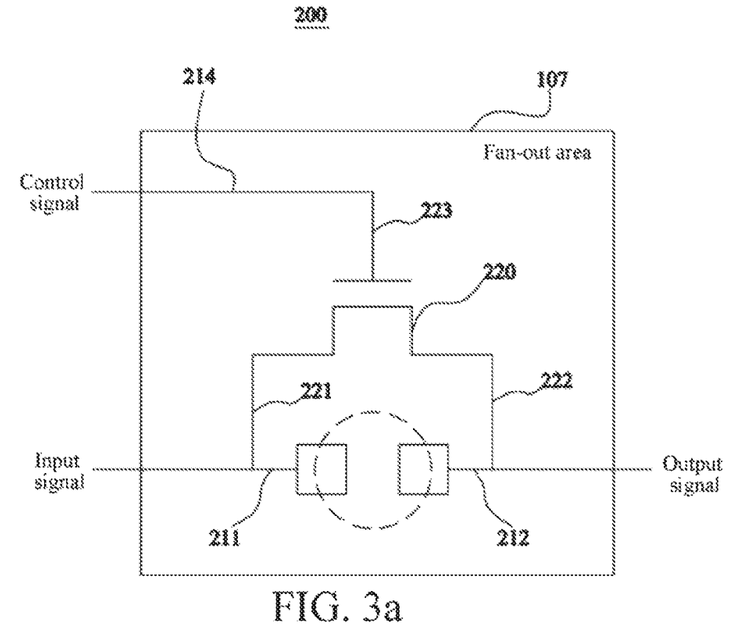
FIG. 3a is a schematic diagram of a broken circuit of a protective circuit of a display panel where an embodiment of a method according to this application is applied.

FIG. 3a is a schematic diagram of a broken circuit of a protective circuit of a display panel where an embodiment of a method according to this application is applied. In some embodiments, the control signal electrically coupling to the control end 223 of the active switch 220 is at a low potential, the input line 211 and the output line 212 form a closed circuit by using the protected wire 213; when the input line 211 obtains power greater than a maximum power threshold the protected line 213 can bear, the protected line 213 is fused, and the input line 211 and the output line 212 form a broken circuit.

Figure 3B:
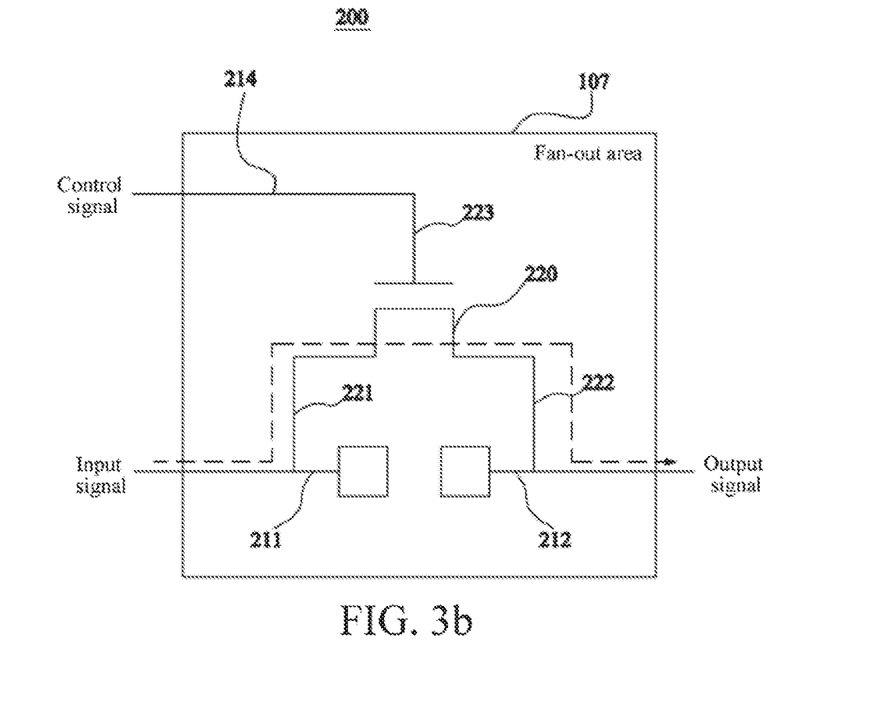
FIG. 3b is a schematic diagram of a closed circuit of a protective circuit of a display panel where an embodiment of a method according to this application is applied.

FIG. 3b is a schematic diagram of a closed circuit of a protective circuit of a display panel where an embodiment of a method according to this application is applied. In an embodiment of this application, the input line 211 and the output line 212 are broken circuits. When the control signal electrically coupling to the control end 223 of the active switch 220 is at a high potential, the active switch 220 is turned on, and the input line 211 and the output line 212 form a closed circuit by using the active switch 220.

Figure 4A:
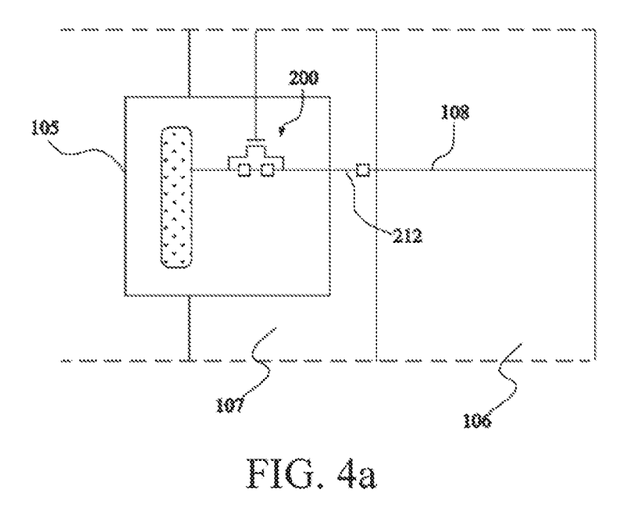
FIG. 4a is a schematic configuration diagram of a protective circuit where an embodiment of a method according to this application is applied.

FIG. 4a is a schematic configuration diagram of a protective circuit where an embodiment of a method according to this application is applied. In an embodiment of this application, the active switch 220 and the input line 211 are arranged on the G-COF 105, and the output line 212 is arranged in a fan-out area 107 of a G-COF 105 side.

Figure 4B:
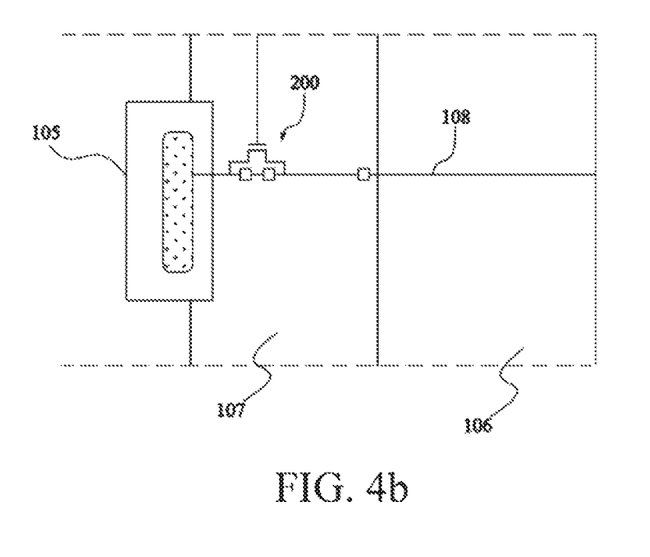
FIG. 4b is a schematic configuration diagram of a protective circuit where an embodiment of a method according to this application is applied.

FIG. 4b is a schematic configuration diagram of a protective circuit where an embodiment of a method according to this application is applied. In an embodiment of this application, both the active switch 220 and the transmission line 210 are arranged in the fan-out area 107 of the G-COF 105 side.

In an embodiment of this application, the active switch 220 and the input line 211 are arranged on an S-COF 104, and the output line 212 is arranged in the fan-out area 107.

In an embodiment of this application, both the active switch 220 and the transmission line 210 are arranged in the fan-out area 107 of an S-COF 104 side.

In an embodiment of this application, the transmission line 210 is a conductive line 108 connected to an effective display area 106 of a display panel.

In some embodiments of this application, the conductive line 108 includes at least one of a scanning line, a data line, a benchmark voltage line, and a gamma voltage transmission line.

In some embodiments, the active switch 220 may be a transistor, for example, an N-MOS field-effect transistor, the first end 221 is a drain, and the second end 222 is a source. This is not limited thereto.

In an embodiment of this application, the protective circuit 200 is arranged on the display panel, and includes: a control line 214, configured to transmit a control signal, where the control signal is switched between a high potential and a low potential, a transmission line 210, including an input line 211 and an output line 212; an active switch 220, where a control end 23 of the active switch 220 is electrically coupled to the control line 214, a first end 221 of the active switch 220 is connected to the input line 211, and a second end 222 of the active switch 220 is connected to the output line 212; and a thermo-sensitive conductive material wire (for example, the foregoing protected wire 213), arranged between the input line 211 and the output line 212. The active switch 220 is arranged between a drive circuit and a display area 106 of the display panel. The active switch 220 is an N-MOS field-effect transistor, the first end 221 is a drain, and the second end 222 is a source. The drive circuit includes at least one of a gate drive circuit and a source drive circuit. The gate drive circuit and the source drive circuit are, for example, the foregoing G-COF 105 and S-COF 104, but are not limited to the G-COF 105 and S-COF 104. When the control signal is at a low potential, the input line 211 and the output line 212 form a closed circuit by using the thermo-sensitive conductive material wire; when the input line 211 obtains power greater than a maximum power threshold the thermo-sensitive conductive material wire can bear, the thermo-sensitive conductive material wire is fused, the input line 211 and the output line 212 form a broken circuit, and the input line 211 and the output line 212 are broken circuits; when the control signal is at a high potential, the active switch 220 is turned on, and the input line 211 and the output line 212 form a closed circuit by using the active switch 220.

Figure 5:
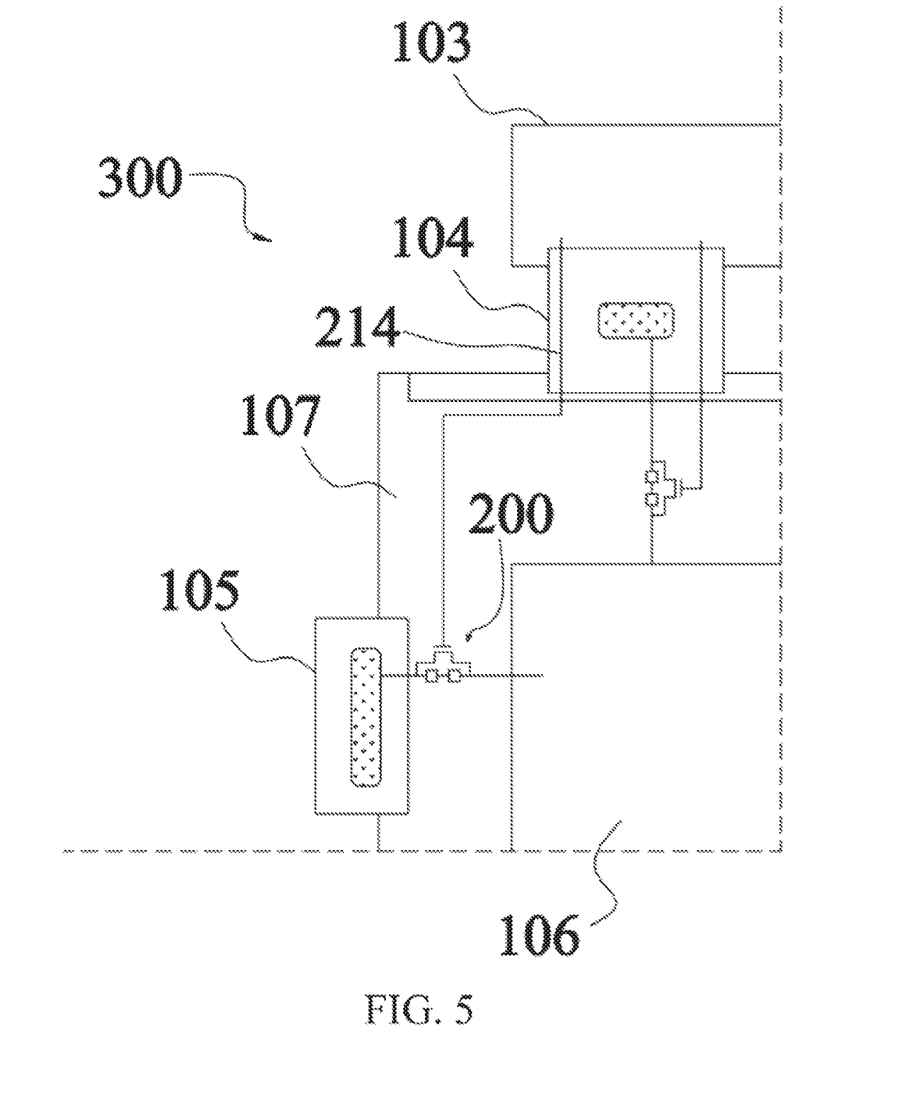
FIG. 5 is a schematic architectural diagram of a display device where an embodiment of a method according to this application is applied.

FIG. 5 is a schematic architectural diagram of a display device where an embodiment of a method according to this application is applied. For ease of understanding, refer to FIG. 1a to FIG. 4b. In an embodiment of this application, a display device in this application includes: a display panel, including a display area 106 and a fan-out area 107; and a control module 300, including: a control line 214, configured to transmit a control signal; a transmission line 210, including an input line 211 and an output line 212, where a protected line 213 is arranged between the input line 211 and the output line 212, the protected line 213 is a thermo-sensitive conductive material wire, the transmission line 210 transmits power, and the transmission line 210 or the output line 212 is arranged in the fan-out area 107; and an active switch 220, where a control end 223 of the active switch 220 is electrically coupled to the control signal, a first end 221 of the active switch 220 is connected to the input line 211, and a second end 222 of the active switch 220 is connected to the output line 212. When the control signal electrically coupling to the control end 223 of the active switch 220 is at a low potential, the input line 211 and the output line 212 form a closed circuit by using the protected line 213; when the input line 211 obtains the power greater than a maximum power threshold the thermo-sensitive conductive material wire can bear, the protected line 213 is fused, the input line 211 and the output line 212 form a broken circuit, and the input line 211 and the output line 212 are broken circuits; when the control signal electrically coupling to the control end 223 of the active switch 220 is at a high potential, the active switch 220 is turned on, and the input line 211 and the output line 212 form a closed circuit by using the active switch 220.

In some embodiments, the control line 214 is electrically coupled to a signal generation module, and the signal generation module generates the control signal. For example, the signal generation module is a PCB, and the control line 214 is connected to a PCB 103 to obtain the control signal transmitted by the control line 214, but the control signal is not limited to being provided by the PCB 103. The control signal includes but is not limited to a color (for example, R/G/B) compression signal, a control signal, and power provided by a system board, a signal processed by a TCON 101, a data signal transmitted by a source circuit (for example, an S-COF 104), a scanning signal transmitted by a gate circuit (for example, a G-COF 105), and a power signal processed or adjusted by a power driver module (not shown). Based on different sources of the control signal, the signal generation module electrically coupling to the control line 214 includes the system board, the TCON 101, the source circuit, the gate circuit, or the power driver module, but is not limited thereto.

In some embodiments, the control module 300 may include any protective circuit 200 in the foregoing embodiments.

This application resolves the problem that a panel is heated and finally burned due to a short circuit between a high-voltage signal and GND or a high-voltage signal of lines without significantly changing an existing production process and increasing product costs while maintaining an original manufacturing process requirement, where the short circuit is caused by foreign matter in a manufacturing process. In addition, overheat protection for the short circuit is implemented, and a function is recovered after repair.

The wordings such as "in some embodiments" and "in various embodiments" are repeatedly used. The wordings usually refer to different embodiments, but they may also refer to a same embodiment. The words such as "include", "have", and "comprise" are synonyms, unless other meanings are indicated in the context thereof.

The foregoing descriptions are merely specific embodiments of this application, and are not intended to limit this application in any form. Although this application has been disclosed above through the specific embodiments, the embodiments are not intended to limit this application. Any person skilled in the art can make some variations or modifications, which are equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. A protective circuit, comprising
a transmission line, comprising an input line and an output line;
a control line, configured to transmit a control signal;
an active switch, wherein a control end of the active switch is electrically coupled to the control line, a first end of the active switch is connected to the input line, and a second end of the active switch is connected to the output line;
a protected wire, arranged between the input line and the output line, wherein
when the control signal electrically coupling to the control end of the active switch is at a low potential, the input line and the output line form a closed circuit by using the protected wire; when the input line obtains power greater than a maximum power threshold the protected line can bear, the protected line is fused, the input line and the output line form a broken circuit, and the input line and the output line are broken circuits; when the control signal electrically coupling to the control end of the active switch is at a high potential, the active switch is turned on, and the input line and the output line form a closed circuit by using the active switch.

2. The protective circuit according to claim 1, wherein the protected wire is made of a thermo-sensitive conductive material.

3. The protective circuit according to claim 1, wherein the output line is arranged in a fan-out area of a display panel.

4. The protective circuit according to claim 1, wherein the transmission line is a conductive line connected to an effective display area of a display panel.

5. The protective circuit according to claim 4, wherein the conductive line comprises at least one of a scanning line, a data line, a benchmark voltage line, and a gamma voltage transmission line.

6. The protective circuit according to claim 1, wherein the control line is electrically coupled to a signal generation module.

7. The protective circuit according to claim 6, wherein the signal generation module generates the control signal.

8. The protective circuit according to claim 6, wherein the signal generation module comprises a system board, a timing controller (TCON), a source circuit, a gate circuit, or a power driver module.

9. The protective circuit according to claim 1, wherein the control signal is switched between a high potential and a low potential.

10. The protective circuit according to claim 1, wherein the active switch is a transistor.

11. A display device, comprising:
a display panel, comprising a display area and a fan-out area; and
a control module, comprising:
a control line, configured to transmit a control signal,
a transmission line, comprising an input line and an output line, wherein a thermo-sensitive conductive material wire is arranged between the input line and the output line, the transmission line transmits power, and the transmission line or the output line is arranged in the fan-out area; and
an active switch, wherein a control end the active switch is electrically coupled to the control line, a first end of the active switch is connected to the input line, and a second end of the active switch is connected to the output line, wherein when the control signal electrically coupling to the control end of the active switch is at a low potential, the input line and the output line form a closed circuit by using the thermo-sensitive conductive material wire; when the input line obtains the power greater than a maximum power threshold the thermo-sensitive conductive material wire can bear, the thermo-sensitive conductive material wire is fused, the input line and the output line form a broken circuit, and the input line and the output line are broken circuits; when the control signal electrically coupling to the control end of the active switch is at a high potential, the active switch is turned on, and the input line and the output line form a closed circuit by using the active switch.

12. The display device according to claim 11, wherein the active switch is arranged between a drive circuit and the display area.

13. The display device according to claim 11, wherein the transmission line is a conductive line connected to an effective display area of the display panel.

14. The display device according to claim 13, wherein the conductive line comprises at least one of a scanning line, a data line, a benchmark voltage line, and a gamma voltage transmission line.

15. The display device according to claim 11, wherein the control line is electrically coupled to a signal generation module.

16. The display device according to claim 15, wherein the signal generation module generates the control signal.

17. The display device according to claim 15, wherein the signal generation module comprises a system board, a timing controller (TCON), a source circuit, a gate circuit, or a power driver module.

18. The display device according to claim 11, wherein the control signal is switched between a high potential and a low potential.

19. The display device according to claim 11, wherein the active switch is a transistor.

20. A protective circuit, arranged on a display panel, and comprising:
 a control line, configured to transmit a control signal, wherein the control signal is switched between a high potential and a low potential;
 a transmission line, comprising an input line and an output line;
 an active switch, wherein a control end the active switch is electrically coupled to the control line, a first end of the active switch is connected to the input line, and a second end of the active switch is connected to the output line; and
 a thermo-sensitive conductive material wire, arranged between the input line and the output line, wherein
 the active switch is arranged between a drive circuit and a display area of the display panel, the active switch is an n-type metal-oxide-semiconductor (N-MOS) field-effect transistor, the first end is a drain, the second end is a source, and the drive circuit comprises at least one of a gate drive circuit and a source drive circuit; when the control signal is at a low potential, the input line and the output line form a closed circuit by using the thermo-sensitive conductive material line; when the input line obtains power greater than a maximum power threshold the thermo-sensitive conductive material wire can bear, the thermo-sensitive conductive material wire is fused, the input line and the output line form a broken circuit, and the input line and the output line are broken circuits; when the control signal electrically coupling to the control end of the active switch is at a high potential, the active switch is turned on, and the input line and the output line form a closed circuit by using the active switch.

\* \* \* \* \*